United States Patent [19]

Galvache

[11] 3,943,405

[45] Mar. 9, 1976

[54] SYSTEM OF CAPACITIVE DISCHARGE IGNITION FOR AUTOMOBILE VEHICLES WITH A CONVERTER GOVERNED BY A MULTI-VIBRATOR

[75] Inventor: Francisco Javier Lanzas Galvache, Madrid, Spain

[73] Assignee: Fabrica Espanola Magnetos, S.A., Madrid, Spain

[22] Filed: June 10, 1974

[21] Appl. No.: 478,000

[30] Foreign Application Priority Data

Feb. 6, 1974 Spain ............................ 422971

[52] U.S. Cl....... 315/209 CD; 323/22 Z; 331/113 R

[51] Int. Cl.$^2$ ........................................ H03K 3/284

[58] Field of Search ......... 315/209 T, 209 CD, 214; 123/148 E; 331/113 R; 323/17;19;22 Z

[56] References Cited

UNITED STATES PATENTS 3,587,002 6/1971 Brown ........................... 331/113 R

*Primary Examiner*—A. D. Pellinen

*Attorney, Agent, or Firm*—Friedman & Goodman

[57] ABSTRACT

A system of capacitive discharge ignition for automobile vehicles with a converter governed by a multi-vibrator, maintains constantly the maximum working current in the power circuit, independently of the feed voltage, by the control of the time of commutation of the multi-vibrator, by using a diode of the Zener type. The diode is connected in parallel with the collector-emitter section of the transistor of the multi-vibrator which is normally shorted to charge the commutation condenser at a fixed voltage which is lower than the lowest value of the voltage of utilization. A transistor with a battery sensor circuit short-circuits part of the resistance of the charging circuit of the condenser when the voltage is higher than a pre-fixed value.

2 Claims, 2 Drawing Figures

SYSTEM OF CAPACITIVE DISCHARGE IGNITION FOR AUTOMOBILE VEHICLES WITH A CONVERTER GOVERNED BY A MULTI-VIBRATOR

The present invention is concerned with a capacitive discharge electronic ignition system for automobile vehicles with a converter governed by a multi-vibrator.

Ignition systems of capacitive type are known in which by means of a converter with a transformer of saturable core, a condenser is charged to a pre-fixed voltage value, which, at the appropriate moment, discharges into the primary of a high tension coil or transformer, the secondary of which is connected to the distributer. The spark plugs of the vehicle are connected to the distributer. These systems of ignition present various disadvantages such as:

a. the necessity of utilizing transistors of high intensities, since when the core of the transformer is saturated, the collector current tends to reach a value given by $Ic=h_{FE}Ib$ and consequently it is necessary to effect a selection of transistors for static gain of current, or to adjust the base current to a maximum value for each transistor, or to utilize transistors of very high intensities.

b. another disadvantages, from the economic point of view, is the use of the saturable core, which involves a high cost and a difficult supply.

c. a further disadvantage is the short duration of the arc between electrodes, which gives rise to greater pollution because of a deficient burning of the mixture. To a certain extent, the duration of the arc has been lengthened by means of systems claimed in our previous U.S. Pat. applications Ser. No. 264,458, now U.S. Pat. No. 3,824,429 and Ser. No. 429,549 filed Jan. 2, 1974.

d. an additional disadvantage is the necessity of utilizing some type of sensor circuit of the battery voltage to charge the condenser in various cycles when the said voltage is inferior to a pre-determined value.

The purpose of the present invention refers to a procedure for eliminating the disadvantages indicated above, by means of the utilization of a core of magnetic sheet in the transformer, and controlling the time of conducting of the power transistor thus governing the maximum intensity in the said transistor.

To avoid charging the condenser in several cycles of the converter, a circuit is used that acts on the charging constant of a circuit R-C lengthening the time of conducting of the power transistor and, therefore, the charging voltage of the condenser. A notable advantage of this system is that better ignition characteristics can be obtained with low battery voltage than in normal functioning, allowing a better starting of the vehicle. To improve the duration of the arc between electrodes, advantage is taken of the discharge of a condenser into an auxiliary winding wound on the same core of the high tension coil, whose time of discharge is that of the arc between contacts.

In order that the object of the invention may be better understood, it will be described in what follows, reference being made to the annexed figures.

Figure 1:
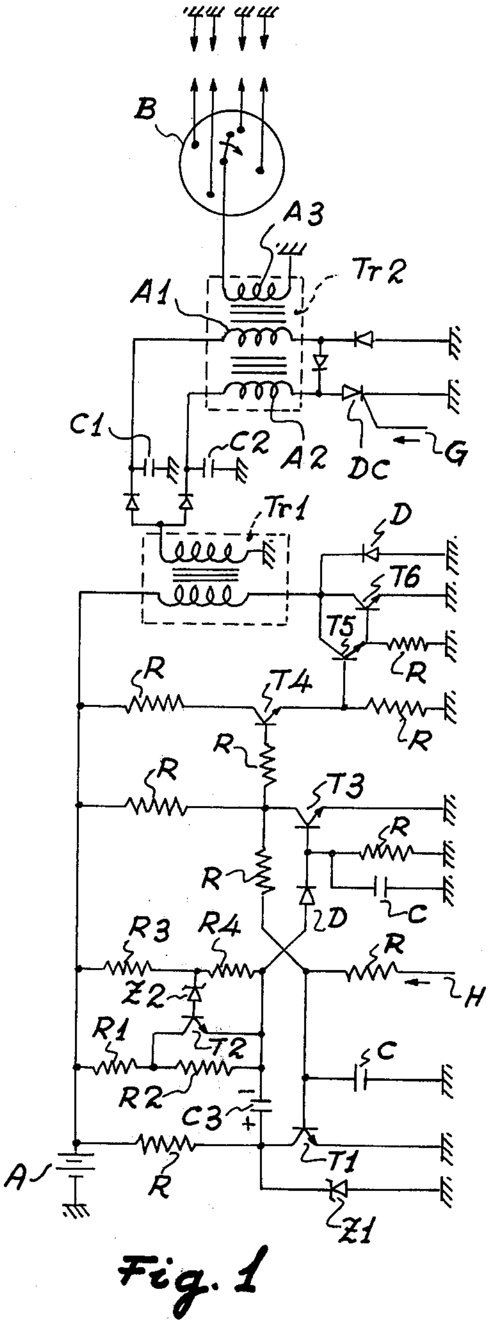
FIG. 1 represents a circuit diagram of a monostable multi-vibrator constructed in accordance with the present invention.

The present invention will now be described where FIG. 1 is the drawing of a realization, without it having a limitative effect on the invention, constituted by a monostable multi-vibrator which comprises two transistors NPN, T1 and T3 with their emitters connected to the negative of the battery A and their collectors through the resistances R to the positive of the same battery. The collector of T1 is connected through the condenser C3 and diode D to the base of T3; this condenser C3 with the set R1—R2—R3—R4 constitutes the resistance-condenser network of the monostable which controls the time of functioning in the unstable state. There is a transistor T2 connected with its collector-emitter section between the point of connection of R1 and R2 and the condenser C3 and diode D and its base through a Zener diode Z2 to the point of connection of R3 and R4. The signal of collector of T3 feeds a chain of amplifiers T4—T5—T6 for controlling the primary current of a transformer Tr1; said transformer has its secondary connected to the condensors C1 and C2 through some rectifying diodes and at the same time to the primaries A1 and A2 of a high tension coil which secondary A3 is connected to the distributor in a conventional and known way. Z1, Z2, are diodes of the Zener type, whose purpose will be indicated and understood in the explanations of the functioning.

Tr1 is a transformer with a magnetic sheet core.

Tr2 is the high tension coil constitued by the windings A1, A2 and A3, which will be hereinafter denominated as follows:

A1 = principal primary winding

A2 = auxiliary primary winding

A3 = secondary winding, whose insulating outlet is connected to the distributor (B) in the conventional and known form.

The R3—R4—Z2—T2 circuit modifies the time constant of the charge of the condenser C3.

The functioning of the system is as follows:

For a clearer understanding we shall assume that the starting phase of the vehicle has been completed and that the battery voltage has a normal functioning voltage of 12.5 to 15V; under these circumstances the selection of R3 and R4 is such that the Zener conducts, and therefore, R2 is short-circuited by the collector-emitter section of the transistor T2 which is in ON.

The state of the transistors is the following:

T1 → OFF

T2 → ON

T3 → ON

T4—T5—T6 → OFF

The condenser C3 is charged, with the polarity indicated in the figure, to a voltage value given by the voltage value of the Zener diode Z1.

By means of the breaker of the distributor or magnetic pick-up, opto-electronic or other type, a pulse reaches the points G (thyristor) and H (monostable), by means of which the two following functions are effected:

a. discharge of the condensers C1 and C2 into the primary windings A1 and A2, there being obtained, by means of the discharge of the condenser C1 into the principal primary winding A1 a voltage in the secondary winding A3, which is high tension, and a very short time of rise, and by means of the discharge of the condenser C2 into the auxiliary primary winding A2 a sufficiently long duration of arc (of the order of 0.5 m. seconds) for the correct functioning of the vehicle.

(b) the state of the mono-stable changes, with the result that the transistors remain in the following state:

T1 → ON

T2 → ON

T3 → OFF

T4, T5, T6 → ON

The ON time is given by the circuit R1-C3 which tends to become charged in a sense contrary to that indicated in FIG. 1, with a time constant $\tau_1 = R1C3$; during this time a current is established in the primary winding of the transfomer Tr1, whose value is defined by the following:

$$Ic = \frac{E}{r} \left(1 - \varepsilon^{\frac{-rtON}{L}}\right) \text{ in which}$$

$r$ = ohmic resistance of the primary
$L$ = inductance of the primary
$E$ = feed voltage When the condensor has discharged, the mono-stable changes its state, returning to the original situation; the commutation of the transistors T5–T6 gives rise to a voltage in the primary which is transferred to the secondary, condensers being again charged, with the result that a new trigger pulse will repeat the previous cycle.

Figure 2:
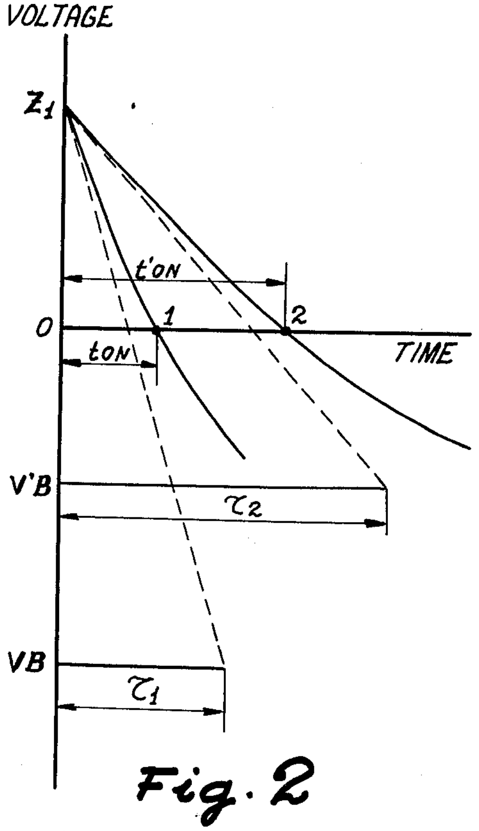
FIG. 2 represents a graph of the voltage of the condenser relative to time, during the unstable state of the multi-vibrator.

Reference will now be made to the necessity and functioning of the resistances R3–R4, the Zener diode Z2, the transistor T2 and the Zener diode Z1, reference being made to the attached FIG. 2.

It has previously been stated that during the stable time of the monostable, the condenser C3 is charged to the value of the Zener diode Z1. During the unstable time (*tON*) the condenser tends to become charged to the value $V_B$ (with a polarity inverse to that indicated in FIG. 1) with a time constant $\tau_1$ = R1.C3; the change of state of the multi-vibrator will be effected at the point 1, and consequently, the ON time of the transistors T5 and T6 is represented by 0–1 in FIG. 2.

At the moment of the starting of the vehicle in which the battery voltage can reach as low values as 6V, if the time of ON of T5 and T6 is maintained, the power stored in the inductance of the primary is so small that the condensers C1 and C2 would charge to a voltage value considerably lower than that of normal functioning and, therefore, upon discharging them on the coil of A.T., the voltage available in the spark-plug would be very low and posing problems in the starting.

For avoiding this, resistances R3 and R4 are selected in such a way that with 9 volts of feed voltage, the Zener Z2 does not conduct nor does, therefore, the transistor T2 which passes to OFF. Therefore, during the starting phase, the condenser C3 which was charged at the voltage of the Zener diode Z1 (<6V) is discharged now having a $V'_B$ with a time constant $$\tau = (R1 + R2).\ C3$$

carrying out the change of state in point 2 of the figure in which it can be observed that $t_{ON}$ = 0–2 is greater than before with which the ON time of T5 and T6 is greater, being more energy stored in the primary and allowing to obtain greater charging voltage in the condensers C1 and C2, and consequently greater power available in the spark-plugs.

An adequate selection of the different components of the system allows for better spark-plug ignition characteristics at the time of the starting than in normal functioning of the vehicle.

In the estimate of the time constants, the resistances R3 and R4 have not been kept in mind since the ohmic value of the same is much greater than the R1 and R2, and, therefore, their contribution is minimum.

With respect to the improvement of duration of the arc, this consists, as has already been stated in the explanation, in utilizing an auxiliary primary winding with high values of resistance or inductances, with the aim that the discharge of the condenser C2 will be slow, and consequently, the arc will be maintained between electrodes.

What is claimed is:

1. A system for capacitive discharge ignition for automobile vehicles having a battery, a distributer and associated spark-plugs, said system including means for maintaining constant ignition characteristics of the spark-plugs independently of feed voltage from the battery, said means including a monostable multi-vibrator connected between the battery and the distributer, control means for controlling time of communtation of said monostable multi-vibrator, said control means including a resistance-condenser network, diode means for charging a condenser of said resistance-condenser network to a constant voltage value lower than lowest value of the voltage of the battery and for discharging said condenser at a time constant which is dependent upon the feed voltage to provide greater power to the spark-plugs than can be obtained normally from the battery when at low voltage, said diode means including a Zener-type diode connected in parallel with a collector-emitter of a first transistor of said monostable multi-vibrator, said first transistor being normally in OFF for charging said condenser, and a second transistor of said monostable multi-vibrator being connected to a resistance of said resistance-condenser network to shortcircuit said resistance when the feed voltage is higher than a prefixed value.

2. A system as claimed in claim 1, wherein said monostable multi-vibrator includes a high tension coil connected to the distributer and an auxiliary condenser, said auxiliary condenser being discharged into an auxiliary primary winding of said high tension coil so that there is obtained a duration of arc dependent on capacity, resistance and inductance of said auxiliary winding for correct functioning of the spark-plugs.

* * * * *